(12) United States Patent
Chen et al.

(10) Patent No.: US 10,325,864 B2
(45) Date of Patent: Jun. 18, 2019

(54) GUARD RING METHOD FOR SEMICONDUCTOR DEVICES

(71) Applicant: TAIWAN SEMICONDUCTOR MANUFACTURING CO., LTD., Hsin-Chu (TW)

(72) Inventors: Hsien-Wei Chen, Hsinchu (TW); Chung-Ying Yang, Taoyuan (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 6 days.

(21) Appl. No.: 15/273,747

(22) Filed: Sep. 23, 2016

(65) Prior Publication Data

US 2017/0012005 A1    Jan. 12, 2017

Related U.S. Application Data

(62) Division of application No. 13/445,229, filed on Apr. 12, 2012, now Pat. No. 9,478,505.

(51) Int. Cl.
| | |
|---|---|
| *H01L 23/58* | (2006.01) |
| *H01L 23/528* | (2006.01) |
| *H01L 23/31* | (2006.01) |
| *H01L 23/00* | (2006.01) |

(52) U.S. Cl.
CPC ........ *H01L 23/585* (2013.01); *H01L 23/5283* (2013.01); *H01L 23/562* (2013.01); *H01L 23/564* (2013.01); *H01L 23/3171* (2013.01); *H01L 2224/02165* (2013.01); *H01L 2224/02166* (2013.01); *H01L 2924/0002* (2013.01)

(58) Field of Classification Search
CPC ... H01L 23/564; H01L 23/562; H01L 23/585; H01L 23/5283; H01L 23/3171
See application file for complete search history.

(56) References Cited

U.S. PATENT DOCUMENTS

| | | | |
|---|---|---|---|
| 6,770,963 | B1 | 8/2004 | Wu |
| 7,196,363 | B2 | 3/2007 | Montagnana |
| 7,567,484 | B2 | 7/2009 | Ochi |
| 7,567,748 | B1 | 7/2009 | Yoo et al. |
| 2002/0045295 | A1 | 4/2002 | Hiraga |
| 2003/0034567 | A1 | 2/2003 | Sato |
| 2004/0084777 | A1* | 5/2004 | Yamanoue .......... H01L 23/5227 257/758 |
| 2004/0195582 | A1 | 10/2004 | Tomita |
| 2006/0022224 | A1 | 2/2006 | Hiroi |

(Continued)

*Primary Examiner* — Mark W Tornow
*Assistant Examiner* — Abbigale A Boyle
(74) *Attorney, Agent, or Firm* — Duane Morris LLP

(57) ABSTRACT

A customized seal ring for a semiconductor device is formed of multiple seal ring cells that are selected and arranged to produce a seal ring design. The cells include first cells that are coupled to ground and second cells that are not coupled to ground. The second cells that are not coupled to ground, include a higher density of metal features in an inner portion thereof, than the first seal ring cells. Dummy metal vias and other metal features that may be present in the inner portion of the second seal ring cells are absent from the inner portion of the first seal ring cells that are coupled to ground. The seal ring design may include various arrangements, including alternating and repeating sequences of the different seal ring cells.

20 Claims, 4 Drawing Sheets

(56) References Cited

U.S. PATENT DOCUMENTS

| | | |
|---|---|---|
| 2007/0001308 A1 | 1/2007 | Takemura et al. |
| 2008/0230874 A1 | 9/2008 | Yamada |
| 2009/0096061 A1 | 4/2009 | Uchida |
| 2009/0115024 A1 | 5/2009 | Jeng |
| 2009/0250783 A1* | 10/2009 | Nakashiba ...... H01L 21/823878 257/508 |
| 2009/0294912 A1 | 12/2009 | Chibahara |
| 2009/0321890 A1 | 12/2009 | Jeng et al. |
| 2011/0156219 A1 | 6/2011 | Kawashima |
| 2011/0233717 A1* | 9/2011 | Jensen ............. H01L 21/76229 257/503 |

* cited by examiner

GUARD RING METHOD FOR SEMICONDUCTOR DEVICES

This application is a division of U.S. patent application Ser. No. 13/445,229, filed Apr. 12, 2012, which is incorporated by reference herein in its entirety.

TECHNICAL FIELD

The disclosure relates to semiconductor devices and methods for manufacturing the same and, more particularly, to semiconductor device chips with customized seal ring designs that include various seal ring cells.

BACKGROUND

An integrated circuit (IC) is a miniaturized electronic circuit including semiconductor devices and passive components and which is manufactured in and on the surface of a substrate typically formed of semiconductor material. Integrated circuits are used in a variety of devices and a multitude of applications due to their low cost and high performance.

A high number of integrated circuits are fabricated simultaneously on a semiconductor substrate. Once the integrated circuits are completed, the semiconductor substrate is sawed into individual chips. The uppermost surfaces of the chips are generally protected by a passivation layer disposed over the integrated circuit. This passivation layer, however, cannot cover the periphery of each chip. Thus, the periphery of each chip is exposed to undesirable moisture and ionic contaminants. Accordingly, guard rings or seal rings as they are alternatively called, are commonly formed around at least the upper periphery of the chip as part of the integrated circuit fabrication process, prior to sawing the substrate. Seal rings are formed of one or multiple metal layers and can provide structural reinforcement and stop undesirable moisture and mobile ionic contaminants from entering chip active circuitry regions and affecting operational reliability. The structural stability of the seal ring has become increasingly important with the advent of extremely low-k, ELK, dielectrics which can be very porous in nature.

Features that can provide structural stability to the seal ring structures are metal vias and other metal structures formed at different device levels. The structures formed in seal rings are not active device structures and are often referred to as dummy metal structures. It is desirable for seal rings to be coupled to ground.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides for customizing seal rings and semiconductor devices. Although seal rings are alternatively referred to as guard rings, they will hereinafter be referred to as seal rings throughout the disclosure. The customized seal rings are provided along the periphery of a chip which contains a semiconductor device such as an integrated circuit. The seal rings are made of more than one type of seal ring cell. In one embodiment, some seal ring cells are coupled to ground and other seal ring cells are not coupled to ground. In various embodiment all of the seal ring cells, except those that appear at the corners of the chip, have the same dimensions.

The disclosure provides the customized seal rings, a customized seal ring design, a method for designing the customized seal rings and a method for manufacturing the customized seal ring on a chip according to the design.

Figure 1:
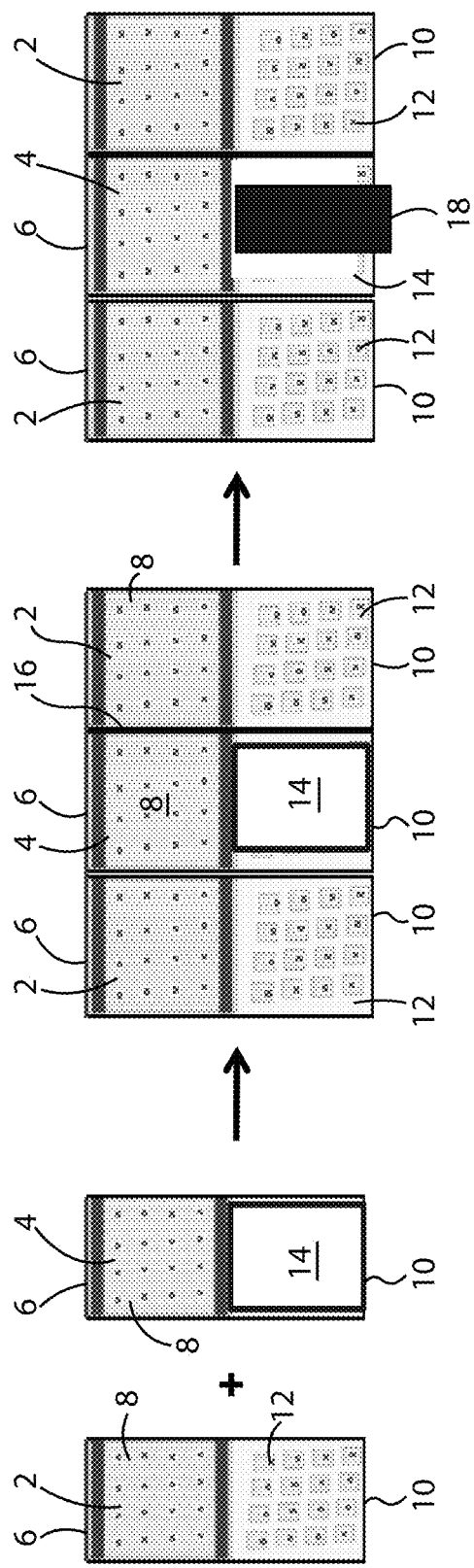
FIGS. 1A-1C are top views showing two seal ring cell types, the arrangement of the seal ring cells, and a ground coupling in one of the seal ring cells, respectively.

FIGS. 1A-1C show how different seal ring cells are arranged along a periphery of a chip according to one embodiment. FIG. 1A shows first seal ring cell 2 and second seal ring cell 4. Each of first and second seal ring cells 2 and 4 have the same dimensions. Outward edges 6 of first and second seal ring cells 2 and 4, are positioned to face the scribe line outside the chip and inner edges 10 of first and second seal ring cells 2 and 4, are disposed inwardly and facing the circuitry of the semiconductor device on the chip. The semiconductor device on the chip is an integrated circuit in one embodiment and represents various other semiconductor devices fabricated in the semiconductor manufacturing industry, in other embodiments.

In the illustrated embodiment, inner zone 12 of first seal ring cell 2 differs from inner zone 14 of second seal ring cell 4. Inner zone 14 generally includes a lesser density of metal features than inner zone 12. In one embodiment, inner zone 14 includes fewer metal layers than inner zone 12. In another embodiment, inner zone 14 includes the same amount of metal layers but fewer connecting dummy metal vias, (DMV's) than inner zone 12 of seal ring cell 2. In one embodiment, inner zone 14 includes DMV's at fewer device levels than in inner zone 12 or than in other portions 8 of second seal ring cells 4. The lower density of metal features in inner zone 14 of second seal ring cell 4 enables ground connection to be made from second seal ring cell 4 to a grounded feature of the semiconductor device. In one embodiment, inner zones 12 and 14 are characterized by inner zone 12 of first seal ring cells 2 having a greater density of metal segments and DMV's than inner zone 14 of second seal ring cell 4. DMV's are so called because they represent vias that connect non-active structures.

Portions 8 are the portions of first seal ring cell 2 and second seal ring cell 4 other than inner zones 12 and 14. In the illustrated embodiment of FIGS. 1A-1C, portions 8 of first seal ring cell 2 and second seal ring cell 4 are represented to be similar. In some embodiments, these other portions 8 of first and second seal rings 2 and 4 are identical. In other embodiments, portions 8 are different. In one embodiment, instead of just the respective inner zones 12 and 14 differing, the entire seal ring cells include different structures in first and second seal ring cells 2 and 4.

FIG. 1B shows an embodiment of first seal ring cells 2 and second seal ring cell 4 disposed adjacent one another according to a chip design and as also will be the case along the peripheral edge of a formed semiconductor device formed on a chip. An aspect of the disclosure is that both first seal ring cells 2 and second seal ring cells 4 are available for chip designers who may design the seal rings to include a seal ring formed of both first seal ring cells 2 and second seal ring cells 4 in various arrangements. First seal ring cells 2 contact second seal rings 4 as they share common boundaries 16. In other embodiments, first seal ring cells 2 are spaced slightly apart from second seal ring cells 4.

FIG. 1C shows the embodiment of FIG. 1B and additionally shows connection 18. Connection 18 is illustrated within inner zone 14 of second seal ring cell 4. In various embodiments, connection 18 is described as a ground connection, and in other embodiments, connection 18 is described as a connection to $V_{ss}$. In some embodiments, such as in digital logic chips, the negative pin identified as the $V_{ss}$ pin is the ground connection. Although the disclosure will refer to the connection hereinafter as the ground connection, the connection may be made to a ground feature or to a $V_{ss}$ feature in various embodiments. Embodiments of connection 18 will be shown in subsequent figures.

Figure 2:
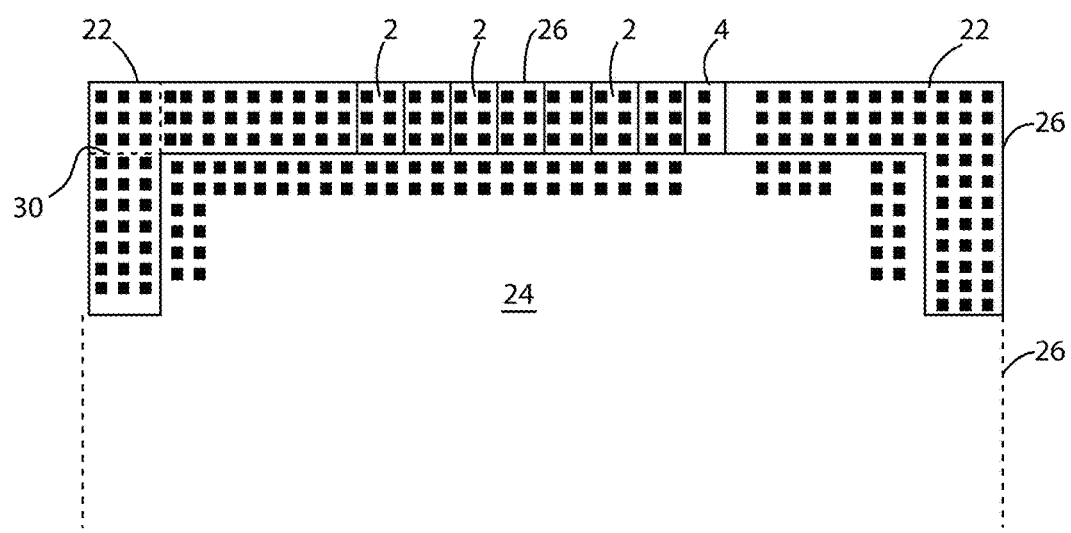
FIG. 2 is a top view showing an arrangement of seal ring cells according to an embodiment of the disclosure.

FIG. 2 shows chip 24 having a peripheral edge 26. Chip 24 is generally rectangular. Along peripheral edge 26 is a seal ring including first seal ring cells 2 and second seal ring cell 4. In the illustrated embodiment, there are seven cells identified as first seal ring cells 2 and one second seal ring cell 4. This is according to the illustrated embodiment and represents one of various arrangements and embodiments. In other embodiments, multiple first and second seal ring cells 2 and 4 are used and first seal ring cells 2 and second seal ring cells 4 appear in an alternating sequence along peripheral edge 26. In another embodiment, first seal ring cells 2 and second seal ring cells 4 appear in a repeating, regular sequence along peripheral edge 26. In one embodiment, the seal ring design includes first seal ring cells 2 that are not coupled to ground, disposed in a regular repeating sequence with second seal ring cells 4 in a ratio of at least 5:1 but other ratios are used in other embodiments. One advantage of the disclosure is that the customer and designer can select any number of first seal ring cells 2 and second seal ring cells 4 and arrange them to appear along the peripheral edge to form the seal ring, according to various design embodiments.

In one embodiment, the designer selects first seal ring cells 2 and second seal ring cells 4 from multiple seal ring cell embodiments and creates a seal ring design that includes at least one of first seal ring cells 2 and at least one of second seal ring cells 4 and customizes the design by positioning the respective seal ring cells in various combinations and in various arrangements along the periphery of the semiconductor chip. In other embodiments, multiple seal ring cells are available for the designer, i.e. there are additional seal ring cell varieties other than simply the two embodiments described above. According to this embodiment, the designer selects at least one first seal ring cell 2 and at least one second seal ring cell 4 in addition to at least one further seal ring cell type. The further seal ring cell type includes a ground connection according to one embodiment and does not include a ground connection according to another embodiment. After the appropriate seal ring cells are selected and arranged to create the seal ring cell design, the semiconductor device including the seal ring is then fabricated in accordance with the design, according to another aspect of the disclosure.

FIG. 2 also shows corner seal ring portions 22. In one embodiment, corner seal ring portions 22 consist of first seal ring portions 2 and second seal ring portions 4. In another embodiment, corner seal ring portions 22 are different than either first seal ring portions 2 or second seal ring portions 4. According to the embodiment in which corner seal ring portion 22 includes first seal ring portions 2 and second seal ring portions 4, the first and second seal ring portions 2, 4 are arranged in alternating, repeating or other sequences up until corner zone 30, in various embodiments. Corner zone 30 includes various configurations and components in various corner seal ring 22 design embodiments.

Figure 3:
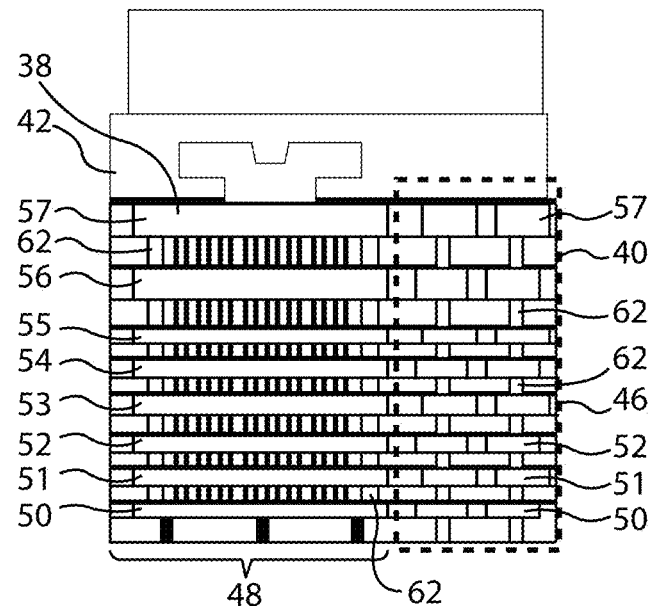
FIG. 3 is a cross-sectional view of an embodiment of a seal ring cell structure according to the disclosure.
Figure 4:
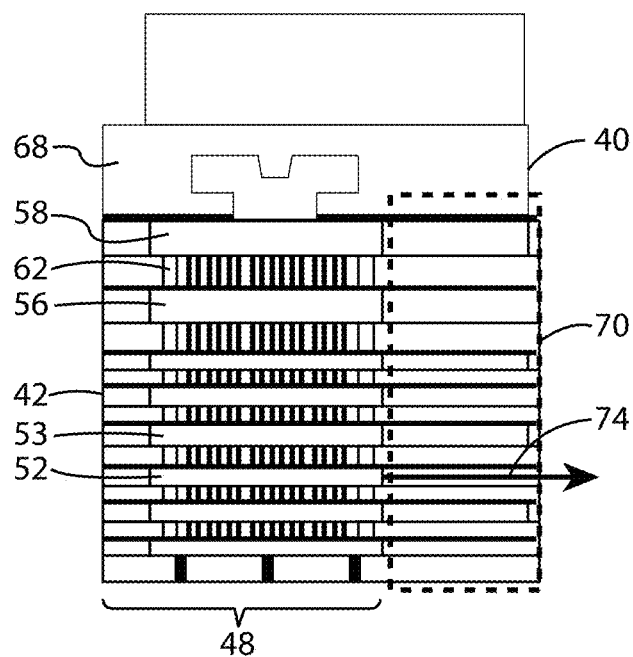
FIG. 4 is a cross-sectional view of an embodiment of a seal ring cell structure according to the disclosure.
Figure 5:
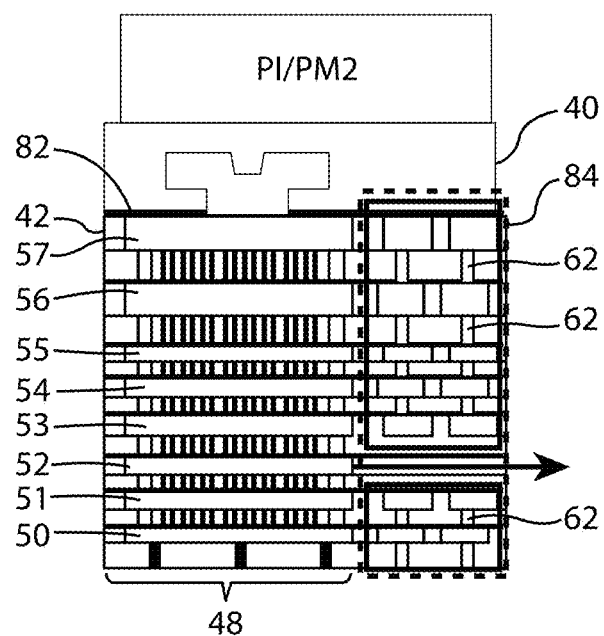
FIG. 5 is a cross-sectional view of another embodiment of a seal ring cell structure according to the disclosure.

FIGS. 3-5 are cross sectional views showing structures of seal ring cell embodiments according to the disclosure. FIG. 3 shows a seal ring cell structure that represents one embodiment of a seal ring cell not coupled to ground, such as first seal ring cell 2 in FIGS. 1A-1C. FIGS. 4 and 5 show seal ring cell structures that represent embodiments of a seal ring cell that is coupled to ground such as second seal ring structure 4 in FIGS. 1A-1C.

FIG. 3 shows a side view of a seal ring cell structure. First seal ring cell structure 38 is disposed along the periphery of a chip and includes inner edge 40 that faces the semiconductor device formed on the chip and outer edge 42 that faces a scribe line. Inner portion 46 is identified by the dashed line and generally corresponds to inner zone 12 of first seal ring cell 2 shown in FIGS. 1A-1C. Portion 48 represents the other zones or portions of first seal ring cell structure 38. Portion 48 is a single zone in one embodiment but includes a central portion and an outer portion, in other embodiments. Inner portion 46 includes metal segments of multiple metal layers including lower, first metal layer 50, second metal layer 51, third metal layer 52, fourth metal layer 53, fifth metal layer 54, sixth metal layer 55, seventh metal layer 56, and eighth, upper metal layer 57. The eight metal layers 50-57 are also present in portion 48 as are DMV's 62 that couple vertically adjacent metal layers. A plurality of dummy metal vias 62 is also present in inner portion 46. Dummy metal vias 62 are referred to as dummy metal vias, DMV's because they connect overlying and underlying metal features but are provided for structural purposes and do not couple active circuitry. In FIG. 3, there are eight levels of DMV's 62. Alternatively stated, inner portion 46 includes eight device levels in which there are DMV's. The eight layers of DMV's 62 are in accordance with the embodiment illustrated in FIG. 3. In other embodiments, different number of layers of DMV's 62 are used in inner portion 46. Also in other embodiments, different numbers of layers of metal layers 50-57 are used in inner portion 46. Also in other embodiments, either or both of portions 48 and inner portions 46 include different numbers of metal layers and different numbers of layers of DMV's 62.

FIG. 4 is a cross sectional view showing second seal ring cell structure 68 which includes a ground connection such as second seal ring cell 4 shown in FIGS. 1A-1C. Second seal ring cell structure 68 includes portion 48 which is identical to portion 48 of first seal ring cell structure 38 shown in the illustrated embodiment of FIG. 3. In other embodiments, respective portions 48 of first seal ring cell structure 38 and second seal ring cell structure 68 are different. Second seal ring cell structure 68 is disposed along the periphery of a chip and includes inner edge 40 that faces the semiconductor device formed on the chip and outer edge 42 that faces a scribe line. Second seal ring cell structure 68 differs from first seal ring cell structure 38 because inner portion 70 of second seal ring cell structure 68 differs from inner portion 46 of first seal ring cell structure 38. In other embodiments, there are various other differences between first seal ring cell structure 38 and second seal ring cell structure 68.

Inner portion 70 is indicated by the dashed line and is generally void of features from metal layers 50-57 and includes no DMV's 62 as are present in inner portion 46 of first seal ring cell structure 38 of FIG. 3. Inner portion 70 is void of the metal segments of multiple metal layers 50-57 such as are present in inner portion 46 of first seal ring cell structure 38 as shown in FIG. 3. In FIG. 4, the absence of DMV's 62 and the segments of metal layers 50-57 shown in FIG. 3, enables ground connection 74. In the illustrated embodiment, schematically shown ground connection 74 indicates a coupling between third metal layer 52 and a ground structure (not shown). The ground structure is part of the integrated circuit or other semiconductor device formed on the chip. Various ground structures are used in various embodiments. In other embodiments, ground connection 74 is made between one or more of the other metal layers 50-51 or 53-57 present in portion 48 of second seal ring cell structure 68. Ground connection 74 represents a metal feature which, in one embodiment, is a lead formed from third metal layer 52 and which extends through inner portion 70, past inner edge 40 and to a ground structure formed within the chip. As such, inner portion 70 of second seal ring cell structure 68 is not completely void of metal layers 50-57 as at least one of the metal layers includes a lead that extends through inner portion 70 and is coupled to a ground feature.

FIG. 5 shows another embodiment of a second seal ring cell structure that is coupled to ground. Second seal ring cell structure 82 includes portion 48 as described above. Portion 48 includes eight metal layers 50-57 as described above. Second seal ring cell structure 82 is disposed along the periphery of a chip and includes inner edge 40 that faces the semiconductor device formed on the chip and outer edge 42 that faces a scribe line. Second seal ring cell structure 82 includes inner portion 84, indicated by the dashed line. Inner portion 84 includes metal segments at metal layers 50, 51, 53, 54, 55, 56 and 57 but is void of metal segments of third metal layer 52. Inner portion 84 also includes multiple levels of DMV's 62 but is void of DMV's 62 at levels above and below third metal layer 52. This void area enables ground connection 74 to be made from third metal layer 52 which is present in portion 48. Ground connection 74 is a metal lead that extends from third metal layer 52 to a ground structure included in the semiconductor device formed adjacent inner edge 40. In other embodiments, the ground connection is made between the ground structure and any of the other metal layers 50-57 present in portion 48 of second seal ring cell structure 82.

In other embodiments, inner portion 84 is characterized by the absence of different layers of metal and associated vias. In yet another embodiment, multiple metal layers and associated DMV's are absent from inner portion 84. In various embodiments, ground connection is provided by a metal lead of any of metal layers 50-57, the metal lead extending through inner portion 84 and isolated from any DMV's 62. A comparison of inner portion 46 of first seal ring cell structure 38 and either of respective inner portions 70 or 84 of second seal ring structures 68 and 82, respectively, reveals that inner portion 46 of first seal ring cell structure 38 has a greater density of metal structures than either of inner portion 70 of second seal ring cell structure 68 or inner portion 84 of second seal ring cell structure 82.

According to one aspect, a semiconductor device is provided. The semiconductor device comprises a chip on a semiconductor substrate and including a semiconductor device thereon, and a seal ring surrounding the semiconductor device and disposed on a periphery of the chip, the seal ring including a plurality of seal ring cells disposed along the periphery, wherein the seal ring cells include first cells and second cells, the first cells not coupled to ground and the second cells coupled to ground.

According to another aspect, a semiconductor device is provided. The semiconductor device comprises a chip on a semiconductor substrate and including a semiconductor device thereon; and a seal ring surrounding the semiconductor device and disposed on a periphery of the chip. The seal ring includes a plurality of seal ring cells disposed along the periphery. The seal ring cells include first cells and second cells, each of the first and second cells including inner portions and central and outer portions. Each of the first and second cells include a plurality of metal layers and a plurality of layers of metal vias between the plurality of metal layers in the central and outer portions, wherein the first cells include the plurality of metal layers and the plurality of layers of metal vias in the inner portions and the second cells include fewer than the plurality of metal layers and fewer than the plurality of layers of metal vias in the inner portions thereof.

According to another aspect, a method for designing a seal ring on a semiconductor chip is provided. The method comprises selecting from a plurality of seal ring cells including first seal ring cells that include a first density of metal structures in an inner portion thereof and do not include a ground connection, and second seal ring cells that include a ground connection and a second density of metal structures greater than the first density of metal structures, in an inner portion thereof. The method also provides creating a seal ring design that includes at least one of the first seal ring cells and at least one of the second seal ring cells positioned along a periphery of a chip to form the seal ring.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of various embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for fabricating an integrated circuit, comprising:
   fabricating at least one semiconductor device; and
   fabricating a seal ring surrounding the at least one semiconductor device in a plurality of metal layers, the seal ring comprising first seal ring cells, second seal ring cells, and corner cells, the corner cells located at respective corners of the seal ring, wherein a sequence of abutting first seal ring cells and second seal ring cells extends an entire distance between at least two adjacent corner cells,
      each of the first seal ring cells including an outer portion having metal segments in said plurality of metal layers and an inner portion having metal vias in said plurality of metal layers, said first seal ring cells not coupled to ground, and
      said second seal ring cells including an outer portion having metal segments in said plurality of metal layers and an inner portion having a ground connection in at least one of the plurality of metal layers, metal vias in fewer than all of said plurality of metal layers, and wherein the ground connection is disposed in one of said plurality of metal layers without metal vias in said second seal ring cells and extends through said inner portion and into said at least one semiconductor device.

2. The method as in claim 1, wherein said first seal ring cells and said second seal ring cells are of a same dimension and include substantially identical outer portions.

3. The method as in claim 1, wherein said fabricating includes forming said first and second seal ring cells in a repeating sequence.

4. The method as in claim 1, wherein said plurality of metal layers include metal line segments.

5. The method as in claim 1, wherein said first seal ring cells comprise a first number of via levels that include dummy metal vias.

6. The method as in claim 5, wherein said second seal ring cells include at least a portion that has fewer via levels that include dummy metal vias than said first number of via levels that include dummy metal vias in said first seal ring cells.

7. The method as in claim 1, wherein at least some of said metal vias of the second seal ring cells are dummy metal vias, and the ground connection is isolated from said dummy metal vias.

8. The method as in claim 1, wherein said inner portions of said first seal ring cells include a higher density of metal segments and vias than said inner portions of said second seal ring cells.

9. The method as in claim 1, wherein said seal ring includes said first seal ring cells and said second seal ring cells appearing in an alternating sequence.

10. A method comprising:
    selecting a sequence of first seal ring cells, second seal ring cells, and corner cells, the second seal ring cells different from the first seal ring cells, such that the sequence of first seal ring cells and second seal ring cells abut each other and extend an entire distance from a first corner cell near a first corner of an integrated circuit (IC) to a second corner cell near a second corner of the IC;
    fabricating the IC, so that the IC includes a seal ring comprising the sequence of first seal ring cells, second seal ring cells, and corner cells, each of the first seal ring cells including an outer portion having metal segments in said plurality of metal layers and an inner portion having metal vias in said plurality of metal layers, said first seal ring cells not coupled to ground, each of the second seal ring cells including an outer portion having metal segments in said plurality of metal layers and an inner portion having a ground connection in at least one of a plurality of metal layers, and metal vias in fewer than all of the plurality of metal layers, and wherein the ground connection is disposed in one of said plurality of metal layers without metal vias in said second seal ring cells and extends through said inner portion and into said at least one semiconductor device.

11. The method of claim 10, wherein said first seal ring cells and said second seal ring cells are of a same dimension and include substantially identical outer portions.

12. The method of claim 10, wherein the sequence includes first seal ring cells and second seal ring cells in a repeating sequence.

13. The method of claim 10, wherein said first seal ring cells comprise a first number of via levels that include dummy metal vias, and said second seal ring cells include at least a portion that has fewer via levels that include dummy metal vias than said first number of via levels that include dummy metal vias in said first seal ring.

14. The method of claim 10, wherein at least some of said metal vias of the second seal ring cells are dummy metal vias, and the ground connection is isolated from said dummy metal vias.

15. The method of claim 10, wherein said first seal ring cells include inner portions with a higher density of metal segments and vias than said inner portions of said second seal ring cells.

16. A method comprising:
    selecting a sequence of first seal ring cells, second seal ring cells, and corner cells, the second seal ring cells different from the first seal ring cells, such that the sequence of first seal ring cells and second seal ring cells abut each other and extend an entire distance from a first corner cell near a first corner of an integrated circuit (IC) to a second corner cell near a second corner of the IC;
    fabricating the IC comprising the sequence of first seal ring cells, second seal ring cells and corner cells, so that outer portions of the first seal ring cells and second seal ring cells form seal ring sides, each of the first seal ring cells including an outer portion having metal segments in said plurality of metal layers and an inner portion having metal vias in said plurality of metal layers, said first seal ring cells not coupled to ground, each of the second seal ring cells including an inner portion having a ground connection in at least one of a plurality of metal layers, and metal vias in each of the plurality of metal layers excluding the at least one of the plurality of metal layers having the ground connection;
    each of the second seal ring cells including an outer portion having metal segments in said plurality of metal layers and an inner portion having a ground connection in at least one of a plurality of metal layers, and metal vias in fewer than all of the plurality of metal layers, and wherein the ground connection is disposed in one of said plurality of metal layers without metal vias in said second seal ring cells and extends through said inner portion and into said at least one semiconductor device.

17. The method of claim 16, wherein said first seal ring cells include inner portions with a higher density of metal segments and vias than said inner portions of said second seal ring cells.

18. The method of claim 16, wherein said first seal ring cells and said second seal ring cells are of a same dimension and include substantially identical outer portions.

19. The method of claim 16, wherein the sequence includes first seal ring cells and second seal ring cells in a repeating sequence.

20. The method of claim 16, wherein said first seal ring cells comprise a first number of via levels that include dummy metal vias, and said second seal ring cells include at least a portion that has fewer via levels that include dummy metal vias than said first number of via levels that include dummy metal vias.

* * * * *